(12) United States Patent  (10) Patent No.: US 7,978,275 B2
Takahashi et al.  (45) Date of Patent: Jul. 12, 2011

(54) ACTIVE MATRIX DISPLAY AND METHOD FOR PRODUCING THE SAME

(75) Inventors: Toshiro Takahashi, Kanagawa (JP); Masaya Nakayama, Kanagawa (JP); Atsushi Tanaka, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 46 days.

(21) Appl. No.: 12/054,146

(22) Filed: Mar. 24, 2008

(65) Prior Publication Data

US 2008/0239185 A1  Oct. 2, 2008

(30) Foreign Application Priority Data

Mar. 30, 2007 (JP) ................. 2007-090851

(51) Int. Cl.
*G02F 1/1368* (2006.01)
(52) U.S. Cl. .......................................... 349/43
(58) Field of Classification Search .............. 349/42–44, 349/158
See application file for complete search history.

(56) References Cited

U.S. PATENT DOCUMENTS

| 3,908,052 | A  | * | 9/1975 | Sanders | 428/1.5 |
| RE40,130 | E | * | 3/2008 | Hasegawa et al. | 349/58 |
| 7,339,192 | B2 | * | 3/2008 | Nishiki et al. | 257/72 |
| 2005/0234231 | A1 | * | 10/2005 | Hashimoto et al. | 536/58 |

FOREIGN PATENT DOCUMENTS

| JP | 7-78690 A | 3/1995 |
| JP | 2002-15859 A | 1/2002 |
| JP | 2003-174171 A | 6/2003 |
| JP | 2004-361774 A | 12/2004 |

* cited by examiner

*Primary Examiner* — Mark A Robinson
*Assistant Examiner* — Eric Wong
(74) *Attorney, Agent, or Firm* — Birch, Stewart, Kolasch & Birch, LLP (57) ABSTRACT

A method for producing a display comprising: forming a plurality of pixels arrayed on a flexible substrate and independently driven by TFTs, wherein the TFTs are formed in such a manner that the direction of the channel length L between the source and drain of each TFT is the direction of two orthogonal directions on the substrate in which the substrate has a smaller dimensional change ratio than the other direction. When the TFTs include a switching TFT and a driving TFT, the TFTs are formed in such a manner that the direction of the channel length between the source and drain of at least the driving TFT is the direction of the two orthogonal directions on the substrate in which the substrate has a smaller dimensional change ratio than the other direction.

7 Claims, 10 Drawing Sheets

ACTIVE MATRIX DISPLAY AND METHOD FOR PRODUCING THE SAME

CROSS REFERENCE TO RELATED APPLICATION

This application claims priority under 35 USC 119 from Japanese Patent Application No. 2007-90851, the disclosure of which is incorporated herein by reference.

BACKGROUND OF THE INVENTION

1. Field of the Invention

The present invention relates to an organic electroluminescence element (organic EL device), an active matrix display including a liquid crystal device, and a method for producing the same.

2. Description of the Related Art

Figure 6:
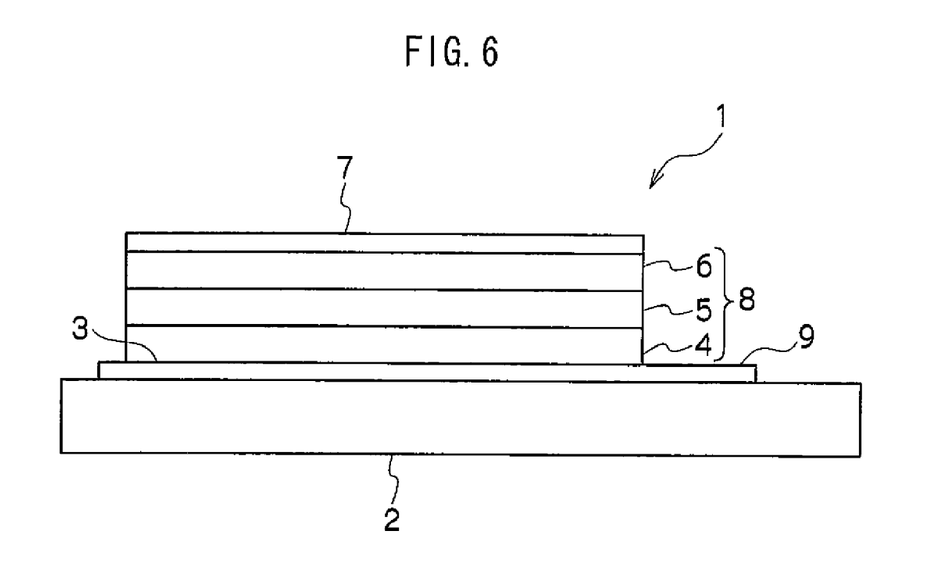
FIG. 6 is a schematic view showing an example of the structure of an organic EL device.

In recent years, flat panel displays including liquid crystal devices, organic EL devices or the like are widely used. FIG. 6 schematically shows the structure of an organic EL device 1. An anode 3, an organic EL layer 8 including a hole transporting layer 4, an emitting layer 5, and an electron transporting layer 6, a cathode 7, and the like are formed on a substrate 2 made of, for example, glass. Upon application of an electric field to the electrodes 3 and 7 through leads 9, the region of the emitting layer 5 sandwiched between the electrodes 3 and 7 is excited to emit light.

Commonly, when color display is desired, multiple pixels emitting different colors such as red (R), green (G), and blue (B) are arrayed on a substrate in orthogonal directions, for example, longitudinally and laterally, and the pixels are independently driven.

These pixels are driven by a passive matrix system or an active matrix system. Under the passive matrix system, anodes, an organic EL layer, and cathodes are sequentially formed on a substrate, and the intersections of the anodes and cathodes are driven to serve as pixels, while under the active matrix system, a TFT (thin film transistor) is formed for each pixel, and the pixel is driven by the TFT. Under the active matrix system, a TFT is formed for each pixel, which makes the structure more complex and increases the production cost in comparison with the passive matrix system. However, the active matrix system has advantages such as high definition, high quality image, and large screens.

Figure 7:
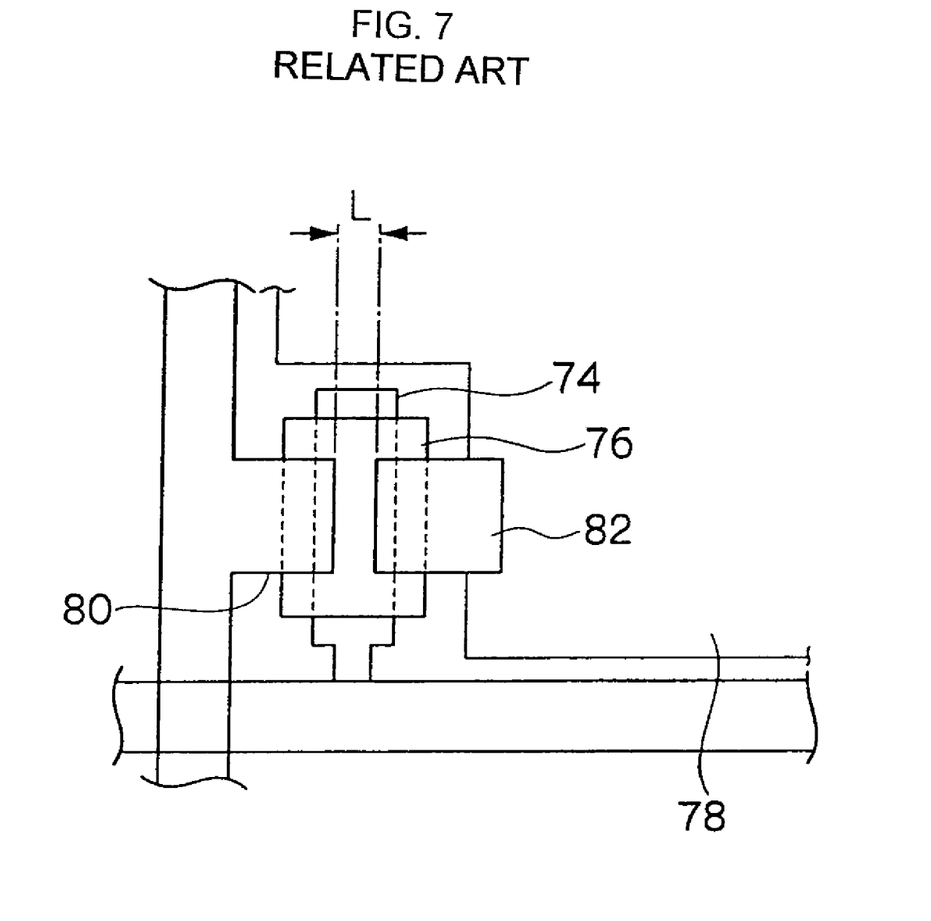
FIG. 7 is a plan view schematically showing an example of the structure of a TFT.
Figure 8:
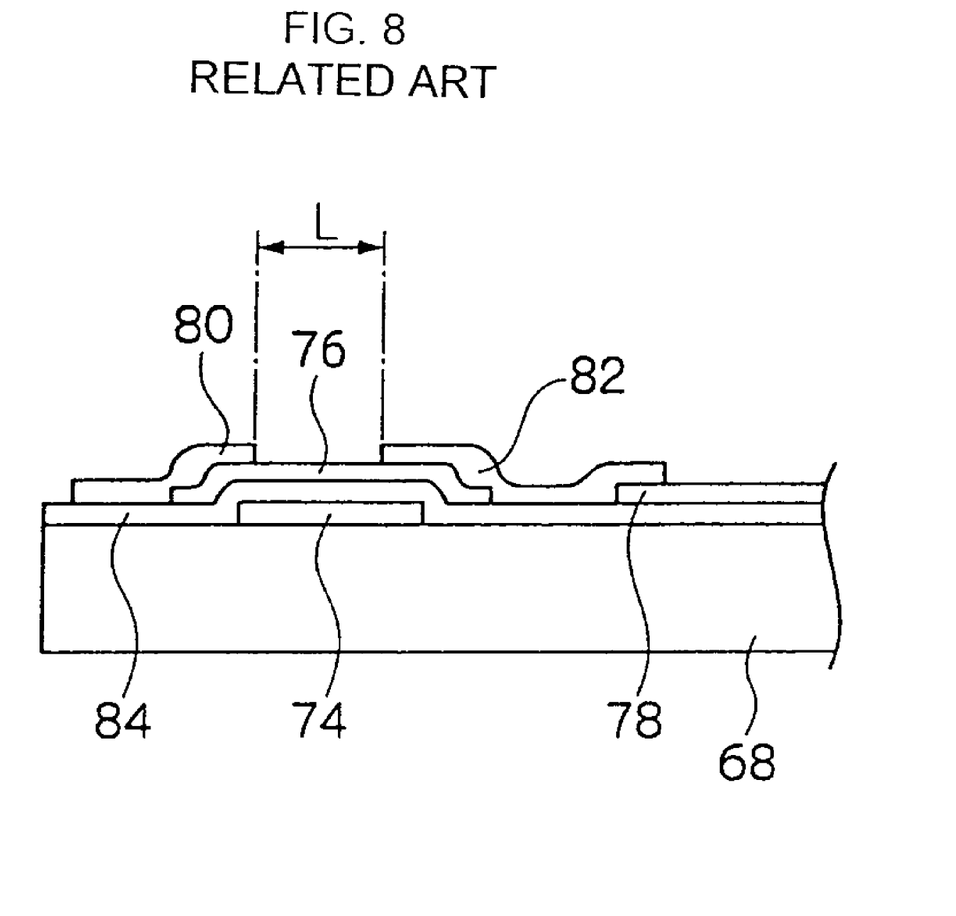
FIG. 8 is a cross sectional view schematically showing an example of the structure of a TFT.

FIGS. 7 and 8 schematically show the basic structure of a TFT. A gate 74, an insulating film 84, a semiconductor layer 76 made of amorphous silicon or polysilicon are sequentially stacked on a substrate 68, and a source electrode 80 and a drain electrode 82 are formed with a predetermined distance L between them on the silicon semiconductor layer 76. The drain electrode 82 is also connected to a pixel electrode 78.

Upon application of a predetermined voltage to the gate 74, an electric current flows between the source and drain through the silicon semiconductor layer 76, thus the electric current is supplied to the pixel electrode 78.

Figure 9:
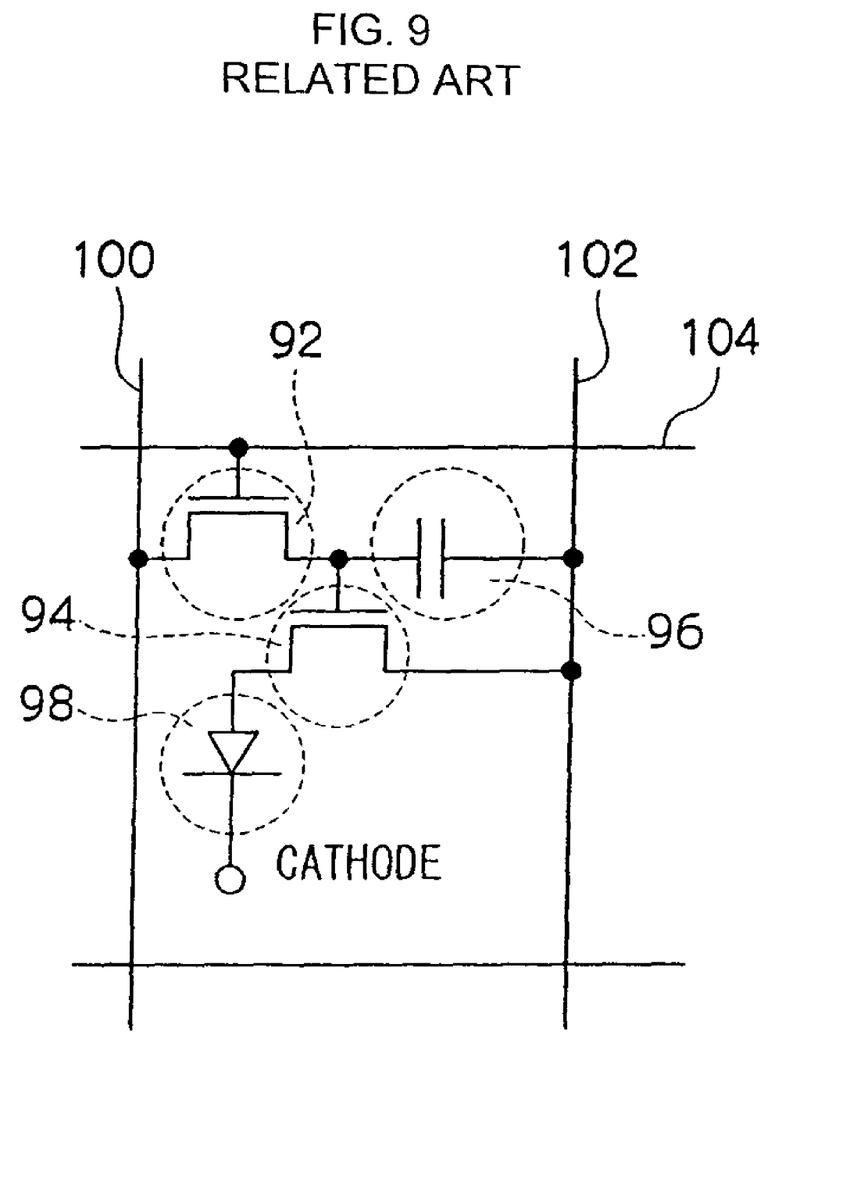
FIG. 9 is a circuit diagram showing the structure of an organic EL display of two transistor type.

In an active matrix organic EL device, plural TFTs are combined to make a circuit. A basic example is that of two transistor type as shown in FIG. 9. A switching TFT 92 and a driving TFT 94 are provided for one pixel, and a capacitor 96 keeps the voltage between the gate and source of the driving TFT 94. These TFTs 92 and 94 are connected to a data line 100, a power supply lead 102, and a scanning line 104. When the switching TFT 92 selected by the scanning line 104 and the data line 100 is turned on, the capacitor 96 is charged to turn on the driving TFT 94, whereby a drain current flows to make an organic EL pixel 98 emit light.

Regarding the substrate, besides a glass substrate, a flexible substrate made of a resin film or a thin metal plate is proposed for displays (for example, Japanese Patent Application Laid-Open (JP-A) Nos. 7-78690, 2002-15859, and 2004-361774). However, particularly in cases where an active matrix display is made using a flexible substrate made of a resin film, the substrate significantly changes in dimension in the production process. When a TFT is made, holes (contact holes) are made thereby contacting the source electrode and drain electrode with the underlying semiconductor layer, so that the dimensional change of the flexible substrate is influential. For example, the position aberration of TFTs or the variation in the source-drain distance (channel length) significantly affects the pixel driving properties of the TFTs, which results in the deterioration in the display performance.

In order to prevent the position aberration of TFTs, there is proposed an active matrix substrate having transistors including functional lines each composed of a center line which has conductive surface and which is coated with an insulating layer and a semiconductor layer (JP-A No. 2003-174171). However, under the method, functional lines having special structures must be used, which increases the production cost or complicates the manufacturing process.

SUMMARY OF THE INVENTION

The invention has been made in view of the above circumstances and provides the following active matrix display and a method for producing the same.

A first aspect of the invention provides a method for producing a display including forming a plurality of pixels arrayed on a flexible substrate and independently driven by TFTs, wherein the TFTs are formed in such a manner that the direction of the channel length between the source and drain of each TFT is the direction of two orthogonal directions on the substrate in which the substrate has a smaller dimensional change ratio than the other direction.

A second aspect of the invention provides a display comprising a flexible substrate and a plurality of pixels arrayed on the substrate and independently driven by TFTs, wherein the TFTs are formed in such a manner that the direction of the channel length between the source and drain of each TFT is the direction of two orthogonal directions on the substrate in which the substrate has a smaller dimensional change ratio than the other direction.

DETAILED DESCRIPTION OF THE INVENTION

The production of an active matrix display composed mainly of an organic EL device is described below with reference to the accompanying drawings.

Figure 5:
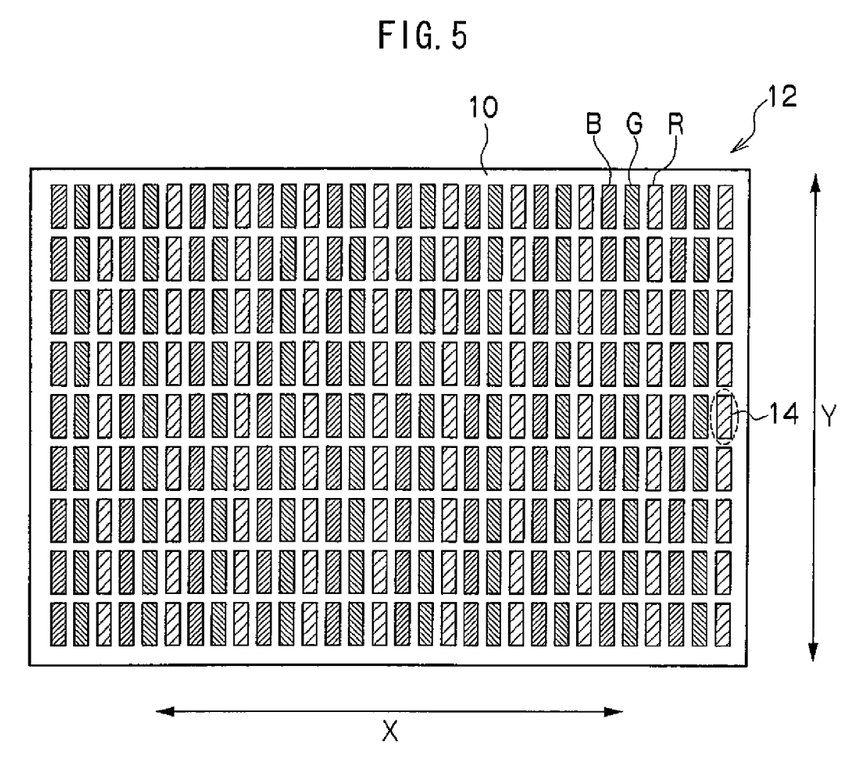
FIG. 5 is a schematic view showing an example of an organic EL display made according to the invention.

FIG. 5 schematically shows an example of an organic EL display wherein pixels 14 are arrayed on a flexible resin film substrate 10. In the display 12, multiple pixels in three colors of RGB are arrayed longitudinally and laterally on the rectangular film substrate 10.

In order to improve mechanical strength, dimensional stability, and thermal stability, the film substrate included in the display 12 is usually a so-called biaxially oriented film that has been stretched in two orthogonal directions, because if uniaxially orientated resins, such as of PEN (polyethylene naphthalate) or PET (polyethylene terephthalate), have directionality in their strength and elongation properties. When an active matrix display is produced using a flexible substrate such as the biaxially oriented film, TFTs have been made with little regard for the directionality of the substrate.

However, biaxial orientation polymers are formed into a film by a roll-to-roll (R to R) process, and therefore the forces exerted in the longitudinal and in the lateral directions are not equal, which results in variations in dimensional stability and thermal stability of the film depending on the axial direction. According to research by the inventors, it has been found that, in the production of a display using a flexible substrate, for example, when a biaxially oriented PEN or PET film having a dimension of 200 mm×200 mm is used as the substrate, the dimensions of the substrate varied due to heating during vapor deposition or due to the solvent used in the photolithography process, resulting in a difference in elongation of about 200 μm between the axial directions.

On the other hand, when pixels having a length of several tens to several hundreds of micrometers are formed on a substrate, the dimensions of the TFTs for individually driving the minute pixels are even smaller, and the channel length between the source and drain is, for example, of the order of a few micrometers. Therefore, subtle differences in the proportional dimensional change of the substrates significantly affect the TFT positions and the channel lengths between the source and drain thereof.

Therefore, in consideration of the difference in the dimensional change ratio of the flexible substrate, the inventors have found the following fact; when TFTs are formed in such a manner that the direction of the channel length between the source and drain of each TFT is the direction of the two orthogonal directions on the substrate in which the substrate has a smaller dimensional change ratio than the other direction, larger connection margins are provided between the semiconductor layer, source, and drain, and property changes caused by contact failure are prevented, which results in the production of a display with excellent display performance.

<Substrate>

The substrate 10 used in the invention is not particularly limited as long as it is a flexible substrate useful as a display substrate, and preferable examples thereof include a biaxially oriented resin film composed of polyester such as polyethylene terephthalate, polybutylene phthalate, or polyethylene naphthalate, polystyrene, polycarbonate, polyether sulfone, polyarylate, polyimide, polycycloolefin, a norbornene resin, or poly(chlorotrifluoroethylene). These film substrates have high light transmission property and strength, and thus are suitable as display substrates.

The thickness of the flexible substrate may be selected depending on, for example, the intended use of the display, and is preferably from about 50 μm to 1 mm, more preferably from about 100 μm to 300 μm from the viewpoints of the strength, light transmission property, and flexibility of the display substrate.

The flexible resin substrate may appropriately include, for example, a gas barrier layer for preventing penetration of moisture and oxygen, a hard coat layer for preventing scratching of the organic EL device, and an undercoat layer for improving flatness of the substrate and adhesiveness of the substrate with the anode.

According to the invention, each TFT is formed in such a manner that the direction of the channel length between the source and drain of the TFT is the direction of the two orthogonal directions on the substrate 10 in which the substrate 10 has a smaller dimensional change ratio than the other direction. The shape of the gate electrode, source electrode, and drain electrode, the structure of the organic EL layer, and the material of the cathode and anode are not particularly limited, and known materials may be used to compose them.

Figure 1:
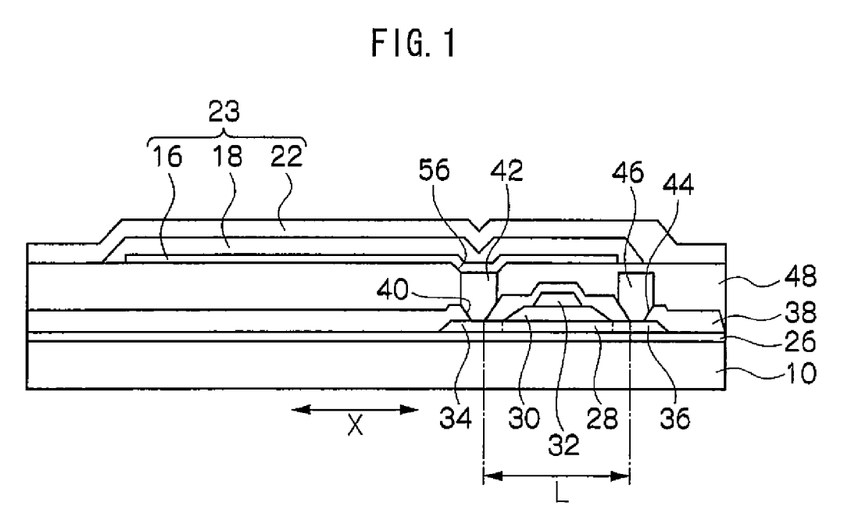
FIG. 1 is a schematic view showing the structure of one pixel of an organic EL display made according to the present invention.

FIG. 1 shows an example of the structure of one pixel of the organic EL display produced according to the invention. In the display as a whole, as shown in FIG. 5, the pixels 14 are arrayed in matrix on the flexible substrate 10.

As shown in FIG. 1, a buffer layer 26 is formed on the flexible substrate 10. A channel layer 28 is formed on the buffer layer 26. A gate electrode 32 is formed on the channel layer 28 with a gate insulating film 30 between them. A source region 36 and a drain region 34 are formed in the channel layer 28 at both sides of the gate electrode 32. Thus, a TFT (thin film transistor) including the gate electrode 32, the source region 36, and the drain region 34 is formed on the buffer layer 26.

An interlayer insulating film 38 is formed on the buffer layer 26 having the TFT formed thereon. A drain electrode 42 connected to the drain region 34 through a contact hole 40, and a source electrode 46 connected to the source region 36 through a contact hole 44 are individually formed on the interlayer insulating film 38.

An interlayer insulating film 48 is formed on the interlayer insulating film 38 having the source electrode 46 and the drain electrode 42 formed thereon. A contact hole 56 extending to the drain electrode 42 is formed in the interlayer insulating film 48.

An organic EL device 23 including a lower electrode (anode) 16 composed of a transparent conductive film such as an ITO (indium tin oxide) film, an organic EL layer 18, and an upper electrode (cathode) 22 composed of, for example, an Al (aluminum) film, or a Mg (magnesium)-Ag (silver) alloy film, is formed on the interlayer insulating film 48 having the contact hole 56 in the region containing the contact hole 56. The lower electrode 16 is electrically connected to the drain electrode 42 of the thin film transistor through the contact hole 56 formed in the interlayer insulating film 48.

The following section describes the method for producing an organic EL display according to the invention, wherein in the organic EL display, pixels driven by TFTs as shown in FIG. 1 are arrayed on a flexible substrate.

Figure 2A:
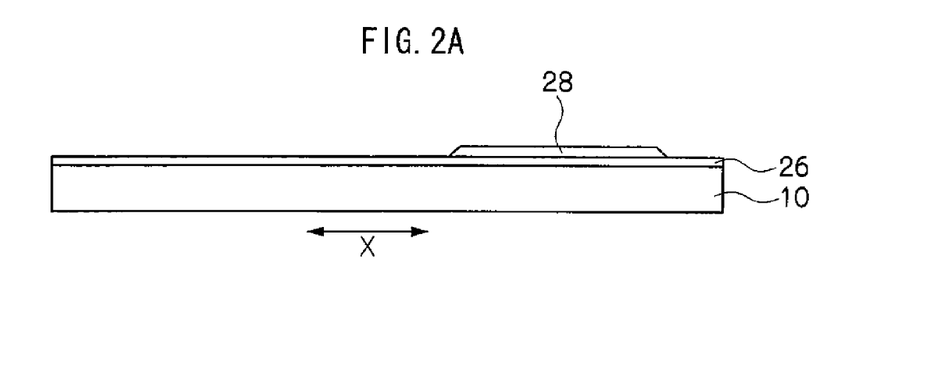
FIG. 2A is a schematic view showing one step in the production of the organic EL display shown in FIG. 1.
Figure 2B:
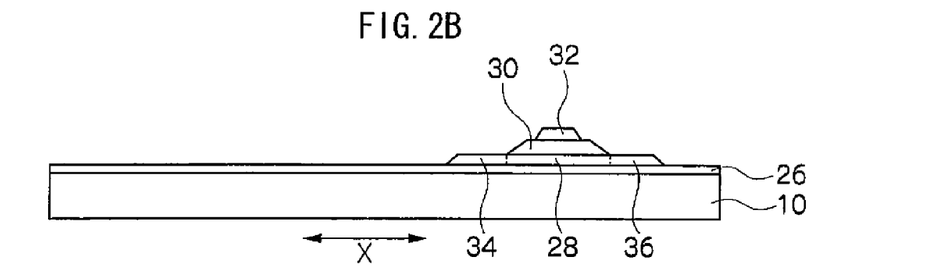
FIG. 2B is a schematic view showing another step in the production of the organic EL display shown in FIG. 1.
Figure 2C:
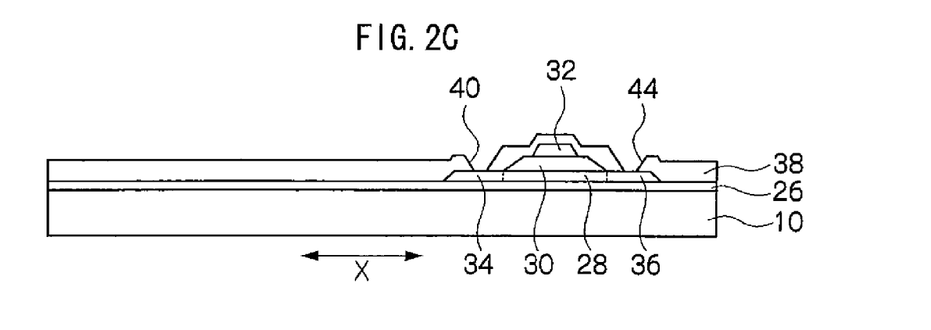
FIG. 2C is a schematic view showing another step in the production of the organic EL display shown in FIG. 1.
Figure 3A:
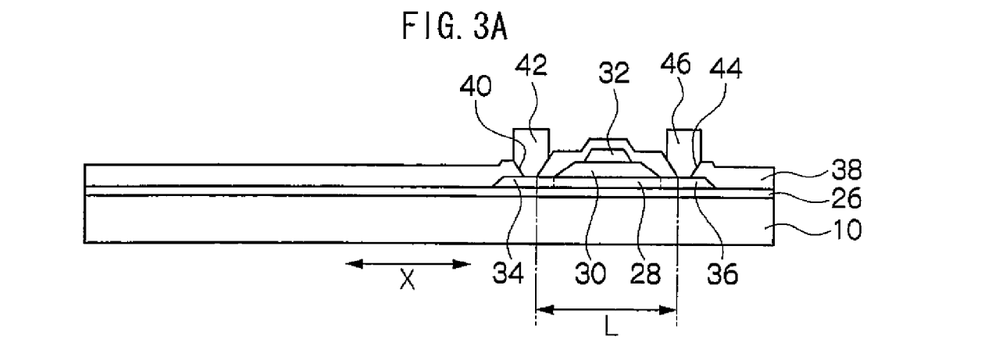
FIG. 3A is a schematic view showing another step in the production of the organic EL display shown in FIG. 1.
Figure 3B:
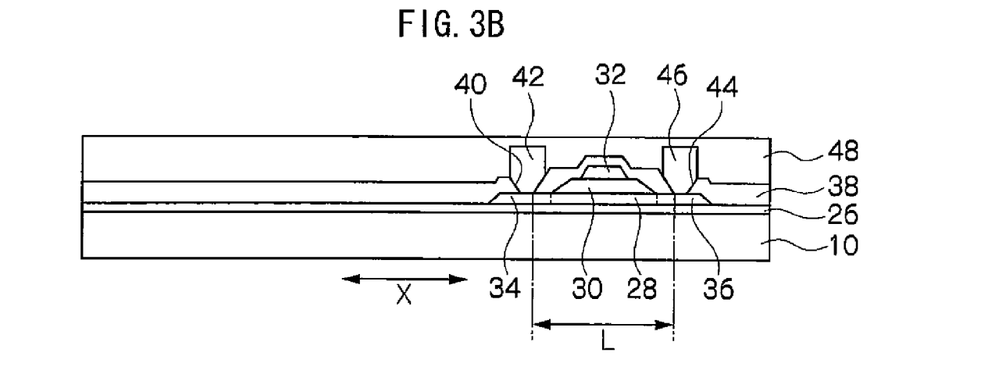
FIG. 3B is a schematic view showing another step in the production of the organic EL display shown in FIG. 1.
Figure 3C:
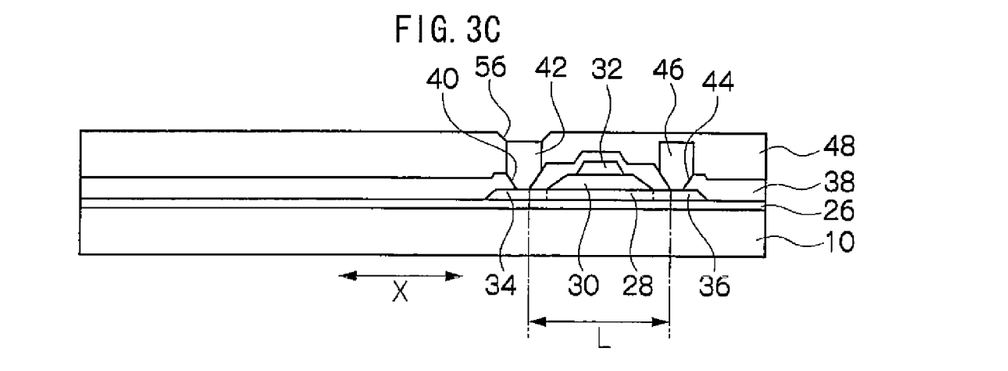
FIG. 3C is a schematic view showing another step in the production of the organic EL display shown in FIG. 1.
Figure 4A:
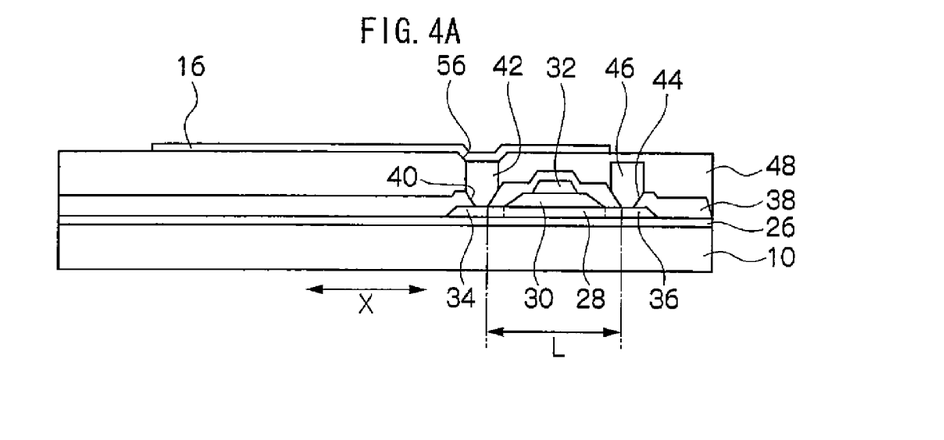
FIG. 4A is a schematic view showing another step in the production of the organic EL display shown in FIG. 1.
Figure 4B:
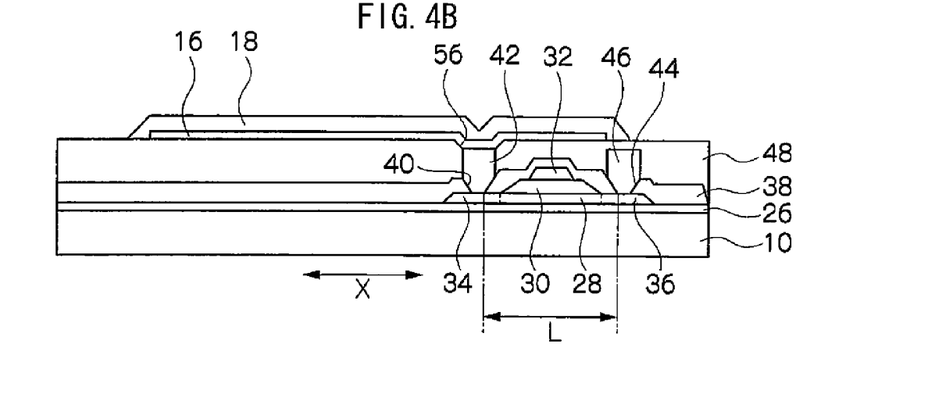
FIG. 4B is a schematic view showing another step in the production of the organic EL display shown in FIG. 1.
Figure 4C:
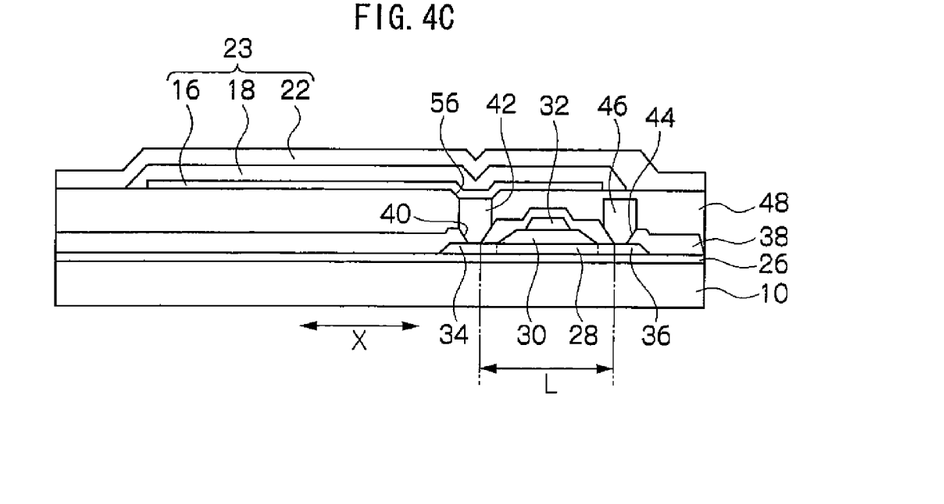
FIG. 4C is a schematic view showing another step in the production of the organic EL display shown in FIG. 1.

FIGS. 2 to 4 sequentially show the processes for producing an organic EL display.

In the first place, a buffer layer 26 composed of a silicon oxide film having a thickness of 300 nm is formed by means of, for example, CVD on a flexible substrate 10.

Subsequently, a polysilicon film having a thickness of 50 nm is formed by means of, for example, CVD on the buffer layer 26. Instead of forming the polysilicon film, an amorphous silicon film may be formed and crystallized to make a polysilicon film by means of, for example, laser annealing.

Subsequently, the polysilicon film is patterned by photolithography and dry etching thereby forming a channel layer 28 composed of the polysilicon film (see FIG. 2A).

A silicon oxide film having a thickness of 100 nm is formed by means of, for example, CVD on the buffer layer 26 having the channel layer 28 formed thereon.

Subsequently, an AlNd (aluminum-neodymium alloy) film having a thickness of 200 nm is formed by means of, for example, sputtering.

Subsequently, the silicon oxide and AlNd films are patterned by means of photolithography and dry etching thereby forming a gate insulating film 30 composed of the silicon oxide film and a gate electrode 32 composed of the AlNd film on the channel layer 28.

Subsequently, phosphorus ions are implanted by means of, for example, an ion implantation method, using the gate electrode 32 as a mask to form a source region 36 and a drain region 34, respectively, in the channel layer 28 at each side of the gate electrode 32 (see FIG. 2B). The ion implantation operation is carried out in such a manner that the direction of the channel length between a source electrode 46 and a drain electrode 42 (between the source and drain), which will be formed later in the source region 36 and the drain region 34, respectively, is the direction of the two orthogonal directions on the substrate 10 in which the substrate 10 has a smaller dimensional change ratio than the other direction.

The description that "the direction of the two orthogonal directions on a substrate in which the substrate has a smaller dimensional change ratio than the other direction" is further described below.

Figure 10:
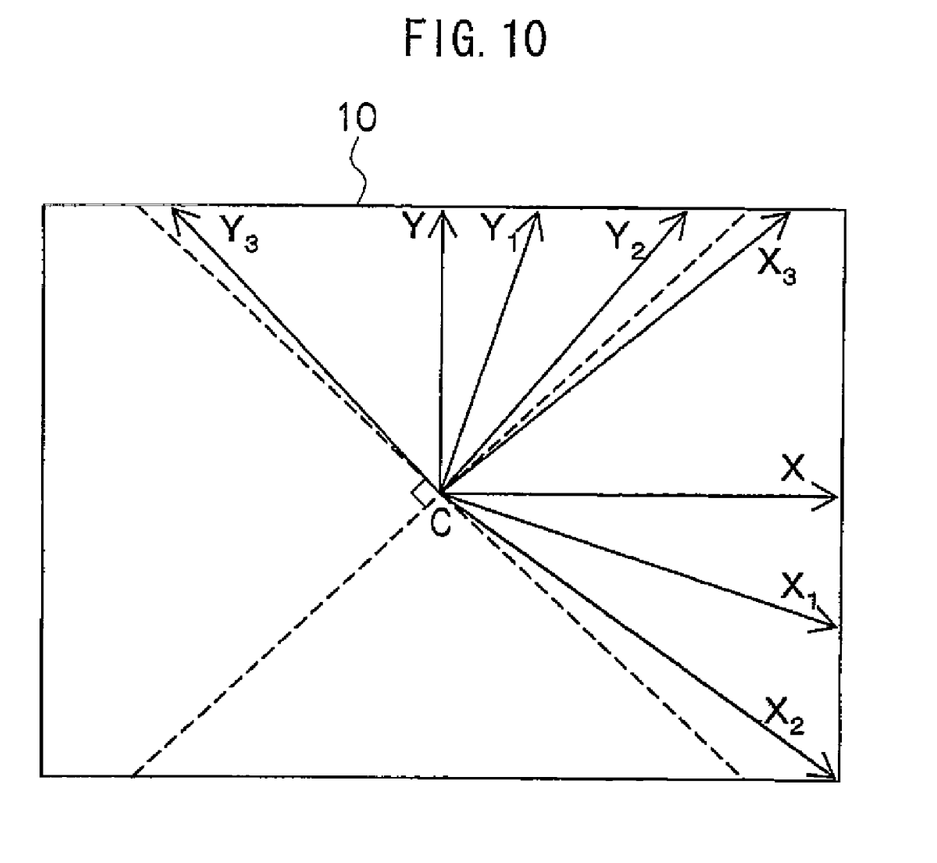
FIG. 10 is a schematic plan view illustrating the two orthogonal directions on the substrate.

FIG. 10 shows a rectangular flexible substrate 10 composed of, for example, a resin film, wherein the long side direction (X direction) and the short side direction (Y direction) are two orthogonal directions. For example, when the dimensional change ratio in the X direction is smaller than that in the Y direction, each TFT is formed in such a manner that the direction of the channel length between the source and drain is along the X direction. The two orthogonal directions on the substrate 10 are not limited to the longitudinal and lateral directions on the substrate, and may be arbitrarily selected. For example, as shown in FIG. 10, in which C is the substrate center, and the $X_1$, $X_2$, and $X_3$ are directions orthogonal to the $Y_1$, $Y_2$, and $Y_3$ directions, respectively, when the dimensional change ratio of the substrate 10 is smaller in the $X_1$, $X_2$, and $X_3$ directions than that in their respective orthogonal directions, each TFT is formed in such a manner that the direction of the channel length between the source and drain of the TFT is one of these $X_1$, $X_2$, or $X_3$ directions.

The dimensional change ratio of the substrate may be determined according to, for example, the temperature to which the substrate is exposed during patterning to form RGB. For example, when a TFT is patterned by means of dry etching, the dimensional change ratio of the substrate is determined on the basis of the difference between the dimensions at the temperature approximate to the temperature during vapor deposition on the substrate and the dimensions at room temperature. More specifically, longitudinal and lateral lengths of a measurement flexible substrate may be measured at 20° C. and 80° C. ($L_{20}$ and $L_{80}$, respectively), and the dimensional change ratio (absolute value) expressed by ($L_{80}$−$L_{20}$)/$L_{20}$ calculated thereby used to determine in advance the direction of larger dimensional change ratio (a first direction) and the direction of smaller dimensional change ratio (a second direction). After determining the direction of larger thermal dimensional change ratio and the direction of smaller thermal dimensional change ratio of the flexible substrate, TFTs and others are formed on flexible substrates which are produced in the same manner as the measurement substrate, in the predetermined direction. For a resin substrate, these directions may usually be taken as the biaxial orientation directions.

As described above, when ions are implanted in such a manner that the direction of the channel length between the source and drain is the direction of the two orthogonal directions on the flexible substrate 10 in which the substrate 10 has a smaller dimensional change ratio than the other direction, a TFT including a gate electrode 32, a source region 36, and a drain region 34 is formed on the buffer layer 26.

Subsequently, an interlayer insulating film 38 composed of a silicon nitride film having a thickness of 450 nm is formed by means of, for example, CVD on the buffer layer 26. Subsequently, a contact hole 44 extending to the source region 36 and a contact hole 40 extending to the drain region 34 are formed by means of photolithography and dry etching in the interlayer insulating film 38 (see FIG. 2C). The contact holes 40 and 44 are formed in such a manner that the direction of the channel length between a source electrode 46 and a drain electrode 42, which will be formed later, is the direction of the two orthogonal directions on the substrate 10 in which the substrate 10 has a smaller dimensional change ratio than the other direction.

Subsequently, a Ti/Al/Ti film composed sequentially of, for example, a titanium (Ti) film having a thickness of 150 nm, an Al film having a thickness of 150 nm, and a Ti film having a thickness of 150 nm is formed by means of, for example, sputtering on the interlayer insulating film 38 having the contact holes 40 and 44.

Subsequently, the Ti/Al/Ti film is patterned by means of photolithography and dry etching thereby forming the source electrode 46 and the drain electrode 42 each composed of the Ti/Al/Ti film (see FIG. 3A). They are formed in such a manner that the distance between the source electrode 46 and the drain electrode 42 is the channel length L, and the direction of the channel length between the source and drain is the direction of the two orthogonal directions on the substrate 10 in which the substrate 10 has a smaller dimensional change ratio than the other direction.

Subsequently, an interlayer insulating film 48 composed of, for example, a silicon oxide film having a thickness of 400 nm is formed by means of, for example, CVD on the interlayer insulating film 38 having the source electrode 46 and the drain electrode 42 (see FIG. 3B). The interlayer insulating film 48 is not limited to a silicon oxide film, and may be an inorganic insulating film such as a silicon nitride film, or an insulating film composed of a resin such as an acrylic resin.

Subsequently, a contact hole 56 extending to the drain electrode 42 is formed by means of photolithography in the interlayer insulating film 48 (see FIG. 3C).

A transparent conductive film composed of ITO having a thickness of 100 nm is formed by means of, for example, sputtering on the interlayer insulating film 48 having the contact hole 56, and then the transparent conductive film is patterned in a rectangular shape for each pixel by means of photolithography and etching. Thus, a rectangular lower electrode 16 composed of a transparent conductive film is formed on the interlayer insulating film 48 (see FIG. 4A).

The lower electrode 16 is electrically connected to the drain electrode 42 through the contact hole 56. The shape of the lower electrode 16 is not limited to rectangle, but may be selected from various shapes.

Subsequently, an organic EL layer 18 including a hole injecting layer, a hole transporting layer, and an emitting layer is formed on the lower electrode 16. The hole injecting layer may be, for example, a 2-TNATA (4,4',4''-tris (2-naphthylphenylamino)triphenylamine) film, the hole transporting layer may be, for example, an α-NPD (N,N'-dinaphthyl-N, N'-diphenyl-[1,1'-biphenyl]-4,4'-diamine) film, and the emitting layer may be, for example, an $Alq_3$ (tris(8-hydroxy quinolinate) aluminum) film. For example, a 2-TNATA film having a thickness of 20 nm, an α-NPD film having a thickness of 20 nm, and an $Alq_3$ film having a thickness of 50 nm are formed in order by means of vacuum deposition through a vapor deposition mask having an opening of predetermined size. Thus, the organic EL layer 18 having a hole injecting layer composed of the 2-TNATA film, a hole transporting layer composed of the α-NPD film, and an emitting layer composed of the $Alq_3$ film is formed on the lower electrode 16 (see FIG. 4B).

The organic EL layer 18 is formed in a rectangular shape having a width larger than that of the lower electrode 16 so that the organic EL layer covers the lower electrode 16. The shape of the organic EL layer 18 is not limited to rectangle, but may be selected from various shapes according to, for example, the shape of the lower electrode 16.

When full-color display is desired, emitting layers having different emission wavelengths must be formed in the pixel region. For example, using a mask having openings corresponding to pixel regions, emitting layers emitting RGB colors, respectively, are formed one by one in the order of RGB by means of vapor deposition with the mask moved at predetermined pitches.

When a TFT is made as described above, the direction of the channel length between the source and drain is formed in the direction X of the orthogonal directions on the substrate in which the substrate 10 has a smaller dimensional change ratio than the other direction, whereby larger connection margins are provided between the semiconductor layer and each of the source and drain, and property changes caused by contact failure are prevented.

Subsequently, an Al film having a thickness of 30 nm or less and light transmission property, and a transparent conductive film composed of ITO having a thickness of 30 nm are formed in order on the interlayer insulating film 48 having the organic EL layer formed thereon 18 by means of, for example, vacuum deposition and sputtering through a mask having an opening in a predetermined shape, and thus an upper electrode (cathode) 22 is formed (see FIG. 4C). The upper electrode 22 is formed all over the display region where pixels are arrayed, and serves as a common electrode.

The layer structure, thickness of the films, and emission colors of the organic EL device 23 are not limited to the above-described examples, and may be appropriately selected according to the intended use. Examples of the structure of the organic EL layer include the following layer structures, but the invention is not limited to them.

Anode/emitting layer/cathode

Anode/hole transporting layer/emitting layer/electron transporting layer/cathode Anode/hole transporting layer/emitting layer/blocking layer/electron transporting layer/cathode Anode/hole transporting layer/emitting layer/blocking layer/electron transporting layer/electron injecting layer/cathode Anode/hole injecting layer/hole transporting layer/emitting layer/blocking layer/electron transporting layer/cathode Anode/hole injecting layer/hole transporting layer/emitting layer/blocking layer/electron transporting layer/electron injecting layer/cathode The method for forming the emitting layers is not limited to mask vapor deposition, and may be a known method such as ink jet or printing.

<Sealing Member and Others>

After the upper electrode 22 is formed, the organic EL device is covered with a sealing member (protective layer) thereby preventing the deterioration of the organic EL device caused by moisture or oxygen. The sealing member may be, for example, glass, metal, or plastic.

After sealing, the anode and cathode are connected to external wirings (a driving circuit and the like).

As described above, an active matrix organic EL display 12 as shown in FIG. 5 is produced, wherein RGB pixels 14 are arrayed longitudinally and laterally on the flexible substrate 10. In the thus produced organic EL display 12, the TFTs for driving the pixels 14 are formed in such a manner that the direction of the channel length between the sources and drains thereof are along the direction X, of the two orthogonal directions on the substrate 10, in which the substrate has a smaller dimensional change ratio of the substrate 10 than the direction orthogonal to the direction X. The influence of dimensional change of the substrate 10 caused by heating during, for example, vapor deposition, may thereby be suppressed to a small amount. More specifically, the above-described method facilitates improvement in the accuracy of TFT positions, and suppression of variation in the channel lengths, whereby the active matrix organic EL display 12 may be produced with small variations in the driving properties between TFTs. Accordingly, in continuous production of organic EL displays, application of the invention thereto reliably improves the quality and yield.

<Color Filter System>

The above section has described a system for applying emitting layers corresponding to different emission colors by means of mask vapor deposition. Alternatively, a color filter system or a color conversion system may be employed.

When a color display with color filters is to be provided, patterning of subpixels corresponding to RGB may be performed by means of, for example, photolithography on a flexible substrate. The photolithography process includes the application of a resist to the substrate, exposure, alkali development, and removal of the resist with a solvent. The dimension of the film substrate tends to vary in the photolithography process.

Therefore, when the photolithography process including the patterning of pixels on a flexible substrate is employed, it is preferable that TFTs be formed in such a manner that the direction of the channel length between the source and drain of each TFT is the direction of the two orthogonal directions on the substrate in which the substrate has a smaller dimensional change ratio between before and after the photolithography process than the other direction. More specifically, on the basis of a dimensional change ratio between before and after the photolithography process, when TFTs are formed in such a manner that the direction of the channel length between the source and drain of each TFT is the direction in which the substrate has a smaller dimensional change ratio between before and after the photolithography process, larger connection margins are provided between the semiconductor layer and each of the source and drain, and property changes caused by contact failure are prevented.

<Liquid Crystal Display>

The above section has described the production of an organic EL display. The invention is also suitable for the production of displays using liquid crystal devices.

Common liquid crystal displays employ a color filter system whose production includes a photolithography process. In an active matrix liquid crystal display, TFTs for driving pixels are formed. Accordingly, in cases where an active matrix liquid crystal display is produced using a flexible substrate, when TFTs are formed in such a manner that the direction of the channel length between the source and drain of each TFT is the direction of the two orthogonal directions on the substrate in which the substrate has a smaller dimensional change ratio between before and after the photolithography process than the other direction, larger connection margins are provided between the semiconductor layer and each of the source and drain, and property changes caused by contact failure are prevented.

<Electronic Paper>

The invention is also suitable for the production of electronic paper using TFTs. Electronic paper is required to include flexible transistors for the active matrix system. In recent years, attention is being given to organic TFTs including an organic material or the like as a semiconductor. In cases where electronic paper is produced, when TFTs are formed in such a manner that the direction of the channel length between the source and drain of each TFT is the direction of the two orthogonal directions on the substrate in which the substrate has a smaller dimensional change ratio than the other direction, larger connection margins are provided between the semiconductor layer and each of the source and drain, and property changes caused by contact failure are prevented.

<Formation of Plural TFTs for One Pixel>

There are cases, for example, in an active matrix organic EL display, as shown in FIG. 9, where one pixel includes a switching TFT 92 and a driving TFT 94, and includes three or more TFTs. In cases where plural TFTs are formed for one pixel, it is preferable that all the TFTs are formed in such a manner that the direction of the channel length between the source and drain of each TFT is the direction of the two orthogonal directions on the substrate in which the substrate has a smaller dimensional change ratio than the other direction. However, for example, in a two transistor system (conductance controlled grayscale), the defects in the contact of the driving TFT 94 are more influential than those of the switching TFT 92. Therefore, when at least the driving TFT 94 is formed in such a manner that the direction of the channel length between the source and drain of the TFT is the direction of the two orthogonal directions on the substrate in which the substrate has a smaller dimensional change ratio than the other direction, larger connection margins are provided between the semiconductor layer and each of the sources and drains, and property changes caused by defects in the contact are prevented, thereby deterioration of the image quality may be suppressed.

Furthermore, on the substrate 10, for example as shown in FIG. 10, the channel directions of the driving TFT 94 and switching TFT 92 may be formed in the X or $X_1$ directions.

The invention has been described above, but the invention is not limited to the above-described exemplary embodiments. For example, the flexible substrate is not limited to a biaxially oriented film, and may be a film substrate formed by other production method.

In addition, the active matrix display according to the invention may be of bottom emission or top emission type, and, for example, may be an organic EL display including a multi-photon emission device including plural laminated organic EL layers. The invention is also applicable to the production of another active matrix displays including, for example, an inorganic EL device, a plasma device, or an electrophoresis device. The invention is not limited to a full-color display, and is also applicable to, for example, the production of an area-color display, double-sided display, or one-side display.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A display comprising a flexible substrate, TFTs arrayed on the substrate, and a plurality of pixels arrayed on the substrate and independently driven by the TFTs,
   wherein the flexible substrate has a difference in a thermal dimensional change ratio between two orthogonal directions consisting of a direction of a channel length between a source and drain of each TFT and a direction orthogonal to the direction of the channel length on the substrate, the thermal dimensional change ratio being an absolute value expressed by $(L_{80}-L_{20})/L_{20}$ in which $L_{20}$ and $L_{80}$ are lengths of the substrate measured at 20° C. and 80° C. with respect to one of the two orthogonal directions of the substrate, respectively, and
   wherein the direction of the channel length between the source and drain of each TFT is along a direction, from among the two orthogonal directions on the substrate, in which the substrate has a smaller thermal dimensional change ratio than the other direction.

2. The display of claim 1, wherein the TFTs comprise a switching TFT and a driving TFT, and the direction of the channel length between the source and drain of at least the driving TFT is along the direction, from among the two orthogonal directions on the substrate, in which the substrate has a smaller thermal dimensional change ratio than the other direction.

3. The display of claim 1, wherein the display comprises an organic EL device.

4. The display of claim 1, wherein the display comprises a liquid crystal device.

5. The display of claim 1, wherein the display comprises electronic paper.

6. The display of claim 1, wherein the substrate is a biaxially oriented film.

7. The display of claim 6, wherein the biaxially oriented film is a polyethylene naphthalate film or a polyethylene terephthalate film.

* * * * *